United States Patent
Dilkina et al.

(10) Patent No.: US 9,189,570 B2
(45) Date of Patent: Nov. 17, 2015

(54) METHOD FOR DESIGNING THE LAYOUT OF TURBINES IN A WINDFARM

(71) Applicant: INTERNATIONAL BUSINESS MACHINES CORPORATION, Armonk, NY (US)

(72) Inventors: Bistra Dilkina, Ithaca, NY (US); Jayant R. Kalagnanam, Tarrytown, NY (US); Elena Novakovskaia, Chappaqua, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 77 days.

(21) Appl. No.: 14/047,425

(22) Filed: Oct. 7, 2013

(65) Prior Publication Data
US 2014/0107985 A1     Apr. 17, 2014

Related U.S. Application Data

(63) Continuation of application No. 12/712,836, filed on Feb. 25, 2010, now Pat. No. 8,554,519.

(51) Int. Cl.
*G06F 17/50*     (2006.01)
*G06Q 10/04*     (2012.01)

(52) U.S. Cl.
CPC ............... *G06F 17/50* (2013.01); *G06Q 10/04* (2013.01); *F05B 2240/96* (2013.01); *F05B 2260/82* (2013.01)

(58) Field of Classification Search
CPC ..... G06Q 10/04; G06F 17/5086; G06F 17/50; F05B 2260/82; F05B 2240/96

USPC ............................................................ 703/1
See application file for complete search history.

(56) References Cited

U.S. PATENT DOCUMENTS

| | | | |
|---|---|---|---|
| 8,554,519 B2 * | 10/2013 | Dilkina et al. | 703/1 |
| 2005/0108150 A1 * | 5/2005 | Pethick et al. | 705/38 |
| 2009/0099702 A1 | 4/2009 | Vyas et al. | |
| 2009/0295165 A1 | 12/2009 | Giguere et al. | |
| 2010/0237617 A1 * | 9/2010 | Vyas et al. | 290/44 |
| 2011/0307109 A1 * | 12/2011 | Sri-Jayantha | 700/291 |

OTHER PUBLICATIONS

U. Aytun Ozturk, Bryan A. Norman, "Heuristic methods for wind energy conversion system positioning" Electric Power Systems Research 70 (2004), pp. 179-185.
Kusiak, A., et al., "Design of wind farm layout for maximum wind energy capture", Renewable Energy, Mar. 2010, pp. 685-694, vol. 35, Issue 3.

(Continued)

*Primary Examiner* — Dwin M Craig
(74) *Attorney, Agent, or Firm* — Scully, Scott, Murphy & Presser, P.C.

(57) ABSTRACT

A method and system for designing a layout of turbines on a grid is provided. The method comprises receiving wind data for each possible location of placement of a turbine on said grid; calculating an energy yield for a given layout of turbines on said grid as a nonlinear objective function, said function constrained by said wind data; implementing a bounding heuristic, said bounding heuristic comparing said calculated energy yield for said given layout of turbines to a current lower bound, and if said calculated energy yield is greater than the current lower bound, replacing the current lower bound with the calculated energy yield; and repeating the above steps for different layouts of turbines on the grid.

20 Claims, 6 Drawing Sheets

| SCENARIO | 1 | 2 | 3 | 4 | 5 | 6 |
|---|---|---|---|---|---|---|
| FARM AREA $m^2$ | 160000 | 230400 | 268800 | 307200 | 460800 | 384000 |
| GRID CELLS | 11x11 | 13x13 | 13x15 | 13x17 | 13x21 | 13x25 |
| NUMBER OF LOCATIONS | 121 | 169 | 195 | 221 | 273 | 325 |
| CHECKERBOARD | 2.5Dx2.5D | 3Dx3D | 3Dx3.5D | 3Dx4D | 3Dx5D | 3Dx6D |
| CHECKER KWh/yr | 6537.4 | 6708.44 | 6781.86 | 6852.94 | 6955.6 | 7031.14 |
| BEST KWh/yr | 6634.53 | 6817.89 | 6964.94 | 7023.3 | 7214.62 | 7230.18 |
| IMPR | 1.49% | 1.63% | 2.70% | 2.49% | 3.72% | 2.83% |

(Columns labeled 302, 304, 306, 308, 310, 312)

(56) References Cited

OTHER PUBLICATIONS

Elkinton, C., et al., "Offshore Wind Farm Layout Optimization (OWFLO) Project: Preliminary Results", Dissertation Abstracts International, 2007, vol. 68, No. 11B, p. 7617, 44th AIAA Aerospace Sciences Meeting and Exhibit, Jan. 9-12, 2006, Reno, Nevada.

Elkinton, C., et al., "Algorithms for offshore wind farm layout optimization", Wind Engineering, 2008, pp. 67-83, vol. 32, No. 1.

Rathmann, O., et al., "Turbine Wake Model for Wind Resource Software"< EWEC 2006 WinD Energy Conference and Exhibition, discussed at conference.

Sorensen, T., et al., "Recalibrating Wind Turbine Wake Model Parameters—Validating the Wake Model Performance for Large Offshore WinD Farms", EWEC 2006 Win Energy Conference and Exhibition, discussed at conference.

* cited by examiner

CHECKERBOARD - 3D x 5D IN 13 x 21

FIG. 1
PRIOR ART

↓ 30% LESS AREA

OPTIMAL LAYOUT IN 13 x 15

FIG. 2

| SCENARIO | 1 | 2 | 3 | 4 | 5 | 6 |
|---|---|---|---|---|---|---|
| FARM AREA $m^2$ | 160000 | 230400 | 268800 | 307200 | 460800 | 384000 |
| GRID CELLS | 11x11 | 13x13 | 13x15 | 13x17 | 13x21 | 13x25 |
| NUMBER OF LOCATIONS | 121 | 169 | 195 | 221 | 273 | 325 |
| CHECKERBOARD | 2.5Dx2.5D | 3Dx3D | 3Dx3.5D | 3Dx4D | 3Dx5D | 3Dx6D |
| CHECKER KWh/yr | 6537.4 | 6708.44 | 6781.86 | 6852.94 | 6955.6 | 7031.14 |
| BEST KWh/yr | 6634.53 | 6817.89 | 6964.94 | 7023.3 | 7214.62 | 7230.18 |
| IMPR | 1.49% | 1.63% | 2.70% | 2.49% | 3.72% | 2.83% |

FIG. 3

$$\Sigma p1 x\_p1 \leq 1 \quad \forall p2, \forall p1: dist(p1,p2) < distcutoff/2$$
FIG. 6A $$x_{p1} + x_{p2} \leq 1 \quad \forall p2, \forall p1: distcutoff/2 \leq dist(p1,p2) < distcutoff$$
FIG. 6B $$P0 = \sum_{wdir} P0_{wdir} = \sum_{wdir} \left( \sum_{\langle wdir, U, frac \rangle} frac * \frac{p}{2} \pi R_t^2 U^3 \right)$$
FIG. 6C $$\delta V_{wdir,p1,p2} = 1 - \frac{V_{wdir,p2}}{U_{wdir,0}} = \left(1 - \sqrt{1 - C_T}\right) * \left(\frac{R}{R + \alpha * dist(p1,p2)}\right)^2$$
FIG. 6D $$\delta V_{wdir,p1,p2} = f\left(\theta_{wdir,p1,p2}\right) * \left(1 - \sqrt{1 - C_T}\right) * \left(\frac{R}{R + \alpha * dist(p1,p2)}\right)^2$$
FIG. 6E $$dist(p1,p2) = \sqrt{(x1 - x2)^2 + (y1 - y2)^2}$$
FIG. 6F $$f(\theta) = \frac{1 + \cos 9\theta}{2}$$
FIG. 6G $$\delta V_{wdir,p2} = \sqrt{\sum_{p1 \in I_{p2,wdir}} \delta V^2_{wdir,p1,p2}}$$

FIG. 6H $$maxP! = \sum_p \left\{ x_p * \sum_{wdir} \left\{ P0_{wdir} * \left(1 - \sqrt{\sum_{pi \in I_{p,wdir}} (x_{pi} * \delta V^2_{wdir,pi,p})}\right)^3 \right\} \right\}$$

FIG. 6I $$maxP! = \sum_p \left\{ x_p * \sum_{\langle wdir,U,frac \rangle} frac * PC_t\left(\left(1 - \delta V_{wdir,p}(x)\right) * U\right) \right\}$$

FIG. 6J $$x_{p1} + x_{p2} \leq 1 \quad \forall p1, p2 : p1! = p2, dist(p1,p2) < distcutoff$$

FIG. 6K $$\sum_p x_p * cost_p \leq B$$

FIG. 6L $$x_{p1} \in \{0,1\} \quad \forall p$$

METHOD FOR DESIGNING THE LAYOUT OF TURBINES IN A WINDFARM

CROSS REFERENCE TO RELATED APPLICATION

This application is a continuation of U.S. patent application Ser. No. 12/712,836 filed Feb. 25, 2010, now U.S. Pat. No. 8,554,519, the entire content and disclosure of which is incorporated herein by reference.

BACKGROUND

The present invention generally relates to windfarms, and more specifically to a method for designing the layout of turbines in a windfarm.

The layout of turbines in a windfarm influences the total amount of power produced by the windfarm. Prior art wind farm layouts are often a simple checkerboard design where turbines are placed a fixed number of diameters apart in one direction and a different fixed number of diameters apart in the perpendicular direction. This is done to minimize the wake interaction effects by maximally separating turbines on the farm. However, the simple checkerboard design is often very conservative and hence leads to very large land use for a given set of turbines. Therefore, the checkerboard design is not often the optimal layout design.

Alternate designs use heuristic methods to design the layout, often leading to designs that have sub-optimal energy yield for a given farm. Most of the existing prior art works that address turbine layout while incorporating wake interaction effects use incomplete heuristic methods. Such methods do not guarantee optimality of the layout solution, and further do not provide a bound on the gap between the best layout found and the optimal layout.

In one reference of the prior art on turbine layout design, the wind farm is divided into a square grid and the center of each grid cell becomes a potential placement location. A genetic algorithm is used to minimize a weighted sum of wind energy and turbine costs. In this context, the genetic algorithm is a solution method where a population of candidate turbine layouts is maintained, and the layouts are evolved into new candidate layouts through mutation and crossover procedures. Another prior art study discloses solution techniques to minimize the cost of energy of a wind farm specified as the total expenditure divided by the total energy produced by the farm. These methods do not necessarily guarantee the optimality of the turbine layout.

Thus, there is a need in the art for a method for designing the layout of turbines in a windfarm that accounts for the nonlinear wake effects and interactions between the turbines to maximize the amount of power (energy yield) from a windfarm site and minimizes the land use for a given power output.

SUMMARY

A method and system for designing a layout of wind turbines in a predefined area (over land or over water) is provided. In one embodiment, the method comprises receiving wind data for each possible location of placement of a turbine on said grid; calculating an energy yield for a given layout of turbines on said grid as a nonlinear objective function, said function constrained by said wind data; implementing a bounding heuristic, said bounding heuristic comparing said calculated energy yield for said given layout of turbines to a current lower bound, and if said calculated energy yield is greater than the current lower bound, replacing the current lower bound with the calculated energy yield; and repeating the above steps for different layouts of turbines on the grid.

In another embodiment, a method for finding a minimum area required for production of a given energy yield, said area associated with a layout of turbines on a grid, said grid representing a land parcel, comprising: a) defining a first area for the grid; b) calculating an energy yield according to a nonlinear objective function produced by placement of the wind turbines on the grid defined by the first area; c) determining if the calculated energy yield for the first area is greater than a threshold value, and if the calculated energy yield is greater than the threshold value then defining a second area for the grid, said second area smaller in size than the first area; d) calculating an energy yield according to a nonlinear objective function produced by placement of the turbines on the grid defined by the second area; e) determining if the calculated energy yield for the second area is greater than the threshold value, and if the calculated energy yield for the second area is greater than the threshold value selecting the second area; and f) repeating steps a to e for subsequently smaller first and second areas until the minimum area required for production of the given energy yield is discovered.

In another embodiment, a system for optimizing the layout of turbines on a grid, said grid representing a land parcel, said system operable to maximize an energy yield produced by the turbines placed on said grid comprising a processor operable to: a) receive wind data and cost data for each possible location of placement of a turbine on said grid; b) calculate an energy yield for a given layout of turbines on said grid as a nonlinear objective function, said function constrained by said wind data and said cost data; c) implement a bounding heuristic, said bounding heuristic comparing said calculated energy yield for said given layout of turbines to an lower bound, and if said calculated energy yield is greater than the current lower bound, replacing the current lower bound with the calculated energy yield; and d) repeat steps a to c for different layouts of turbines on the grid.

A computer readable medium implementing the method is also provided.

BRIEF DESCRIPTION OF DRAWINGS

FIG. 1 is an example of a prior art windfarm checkerboard layout;

FIG. 2 is an example of an optimized layout in accordance with one embodiment of the invention;

FIG. 3 is a table providing comparisons of a checkerboard layout vs. an optimized design in accordance with one embodiment of the invention;

FIG. 6A defines an equation representing a set of all turbine locations that fall within a circle that are mutually exclusive in one embodiment FIG. 6B defines a pairwise proximity constraint equation in one embodiment;

FIG. 6C defines an equation representing a total power, P0, generated by a turbine assuming free stream wind in one embodiment;

FIG. 6D defines an empirically fitted equation representing the lateral wake effect $\delta V$ in one embodiment;

FIG. 6E defines an equation for calculating a single wake effect of a turbine at location p1 to a downstream turbine at location p2 in one embodiment;

FIG. 6F is an equation defining the distance between two locations p1=(x1, y1) and p2=(x2, y2);

FIG. 6G is an equation defining a lateral wake scaling function in one embodiment;

FIG. 6H shows a calculation of a complex multiple wake effect caused by the single wakes of each upstream turbine according to one embodiment;

FIG. 6I is an equation representing a maximum power production across all turbines according to a nonlinear objective function in one embodiment;

FIG. 6J shows an equation representing the power production across all turbines if the power curve is taken into consideration in one embodiment; and FIGS. 6K, 6L and 6M are depictions of constraints on the objective function with FIG. 6K showing an equation representing a pairwise proximity constraint between two turbines; FIG. 6L describing one embodiment of a budget constraint that restricts the total cost or the total number of turbines to be placed; and FIG. 6M illustrating a placement of a turbine at a location expressed as binary variable.

DETAILED DESCRIPTION

Figure 4:
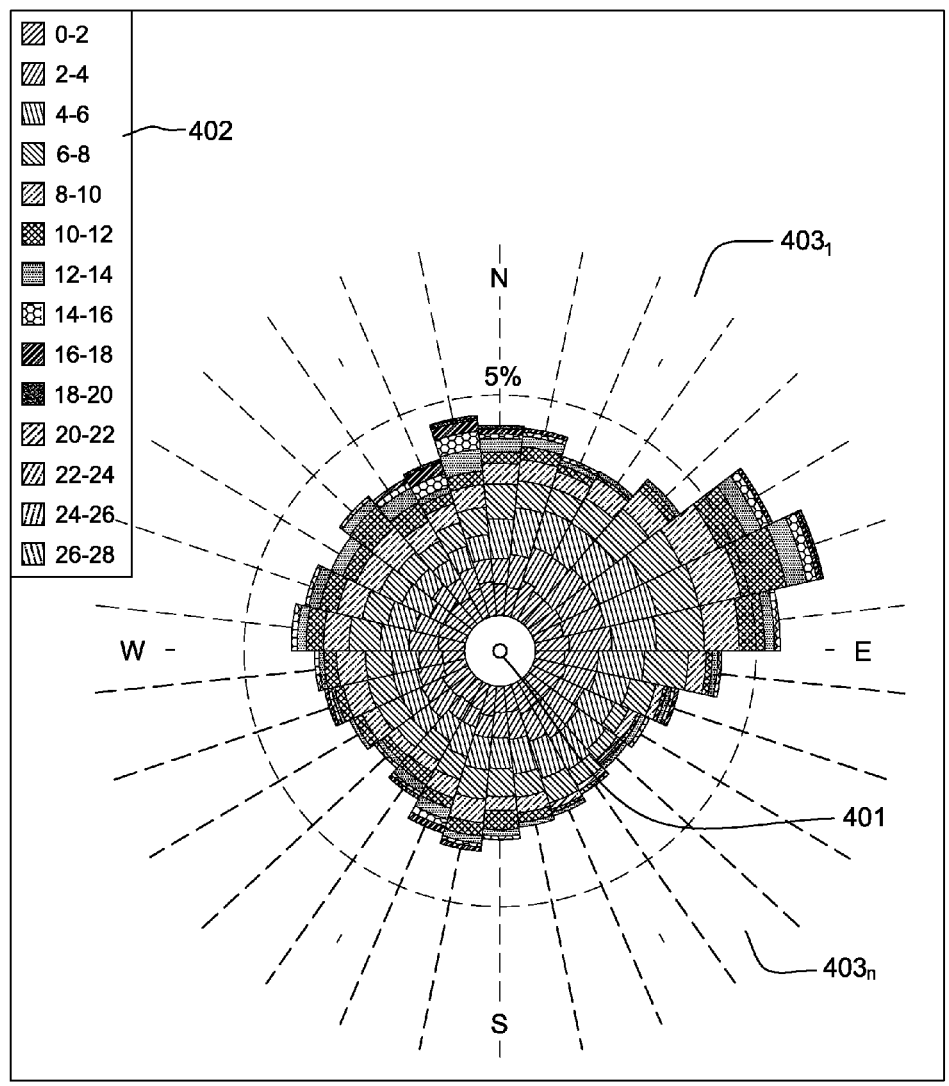
FIG. 4 is a wind bin diagram.

FIG. 1 is an example of a prior art windfarm checkerboard layout 100. In the example shown, the checkerboard comprises 13 squares horizontally across and 21 squares vertically down. Wind turbines $102_1$ to $102_9$, or simply turbines, are evenly distributed throughout the checkerboard layout 100. In the present example, there are nine turbines 102, and the total number of turbines is known before placement. Each turbine 102 is the same fixed distance from its nearest neighbor along the horizontal axis and along the vertical axis. The checkerboard layout 100 does not fully account for differences in turbine interactions, i.e., wake interferences, across a windfarm site.

FIG. 2 is an example of an optimized layout 200 in accordance with one embodiment of the invention. The optimized layout 200 results in at least the same amount of power production as the checkerboard layout 100, but requires approximately 30% less land area. Power production times time (e.g., hours) provides a value known as energy yield (e.g., kilowatt hours or kWh). Typically, the energy yield is calculated over the period of one year and the energy yield for a given windfarm is the amount of power produced by the windfarm measured in kilowatts times the number of hours in one year (i.e., kWh per year). For purposes of comparison to FIG. 1, nine turbines $102_1$ to $102_9$ are distributed throughout the layout. The turbines 102 are placed at various locations throughout the windfarm in accordance with the following constraints: budget and turbine cost, turbine data, wind data and parameters such as lateral angle cutoff for wake interference, wake decay constant, and turbine thrust coefficient. An exemplary turbine is the NORDEX™-N80 2.5MW (N80) turbine manufactured by NORDEX AG of Norderstedt, Germany. One embodiment of the N80 turbine is rated to produce 2500 kW/h, has a turbine radius of 40 m, a cutin speed of 4 m/s, and a cutout speed of 25 m/s.

A further proximity distance cutoff constraint defines the minimum distance between two turbines. The need to calculate every possible proximity distance between turbines can be lessened by constructing a graph with nodes corresponding to the possible locations and edges between all pairs of locations that are closer than the proximity distance cutoff. Each maximal clique on the graph is a set of locations that are mutually incompatible with each other and so at most only one of these locations can be selected for placing a turbine. Then the set of all turbine locations that fall within the circle are mutually exclusive and defined according to the equation shown in FIG. 6A. For locations that are at a distance less than the proximity distance cutoff but equal to or larger than half of the distance cutoff, the pairwise proximity constraint is defined according to the equation shown in FIG. 6B.

The radius is the radius of the circle formed by the turbine blades as the blades rotate. The cutin speed is the minimum wind speed at which the wind turbine 102 will generate usable power. The cutout speed, also known as the furling speed, is the wind speed at which the wind turbine 102 ceases power generation and shuts down. The rated power is the average amount of power the turbine 102 can generate per hour, e.g., 2500 kW/h. The power curve is the amount of power (in kW) put out by the turbine 102 at various wind speeds.

Wind speed data and wind speed distribution data is important because the amount of power increases proportionally by the cube of the wind speed. If wind speed doubles, the amount of power produced by the turbine 102 increases by a factor of eight. A small difference in wind speed within a given area can have a big impact on the amount of power a wind turbine 102 can generate. The total power, P0, generated by a turbine assuming free stream wind can be calculated according to the equation shown in FIG. 6C, wherein P!=power, p=a location on the grid, $x_p$=0 or 1, wdir=wind direction, U=original windspeed, frac=probability of wind direction wdir and wind speed U occurring, $PC_f$=power curve function, W=wind deficit at location p from wind direction.

As shown in FIG. 4, wind speed and wind direction data can be fitted or "binned" to a diagram known as a "wind bin". A wind turbine is located at 'point' 401 in the center of the diagram. The 'wind speeds' 402 (measured in MPH) are completely measured around point 401 over a period of time, e.g., 180 days. In one embodiment, the area surrounding the point 401 is divided up into sectors $403_1$ to $403_n$, and wind speed 402 is measured at distances from the point 401 across each sector 403. In one embodiment, there are thirty 12° sectors 403 that define the area around point 401 and the wind speeds are measured in increments of 2 m/s. The wind bin diagram shows the distribution of wind speeds in the area surrounding the point where the turbine is to be placed.

The wind from a given direction that actually reaches a turbine 102 is a function of the interference or wakes from all of the turbines 102 upstream that fall within the lateral angle cutoff. Wake effects decrease as the distance between turbines increase. The single wake effect of a turbine at location p1 to a downstream turbine at location p2 when they are aligned with the wind direction results in a wind deficit at the downstream turbine calculated according to the equation shown in FIG. 6E, wherein wdir is the wind direction, R is the turbine radius, α is the wake decay constant (WDC), $C_T$ is the turbine thrust coefficient and dist (p1, p2) is the distance between p1 and p2. Wake interference occurs between the turbines when the angle between the turbines is smaller than the lateral angle cutoff.

One analytical model for approximating wake interference is known as the Jensen wake model. Wake effects occur even when the turbines are not exactly aligned with wind direction but the wind and the line between the two turbines form an angle and the angle formed is smaller than the lateral wake angle cutoff. The lateral wake effect δV is given by the following empirically fitted equation shown in FIG. 6D, wherein the distance between two locations p1=(x1, y1) and p2=(x2, y2) is given by the equation shown in FIG. 6F and the lateral wake scaling function is given by the equation shown in FIG. 6G, wherein the angle θ is formed by a line between the two wind turbines located at (p1, p2) and another line formed from the direction of the wind into either p1 or p2.

In one embodiment of the invention, the turbine thrust coefficient ($C_T$) is set to approximately 0.89 and the wake decay constant is set to 0.04 for over water conditions and set to 0.075 for onshore conditions.

Most windfarms comprise multiple turbines, and some of these turbines will be downstream from other turbines and subject to wake interference from these upstream turbines. A set, designated $I_{p2}$, wdir, can be formed for all of the turbines upstream from another turbine and within the cutoff angle for that particular turbine. If the turbines are arranged in straight lines, then the cutoff angle is 0 degrees. If lateral interactions between turbines are considered, then the cutoff angle must be smaller than some threshold value. In one embodiment, the threshold value for the cutoff angle is 15 degrees. A turbine in the wake of multiple turbines upstream with respect to a wind direction is subject to a complex multi-wake interaction. The effect of this complex multiple wake effect can be calculated based on the square root of the sum of the squares of the deficits caused by the single wakes of each upstream turbine according to the equation shown in FIG. 6H.

Given a set of possible placement locations for each turbine 102, a maximum power production across all turbines may be calculated according to the nonlinear objective function shown in FIG. 6I, wherein P'=power, p=a location on the grid, $x_p$=0 or 1, wdir=wind direction, P0wdir=power produced by turbine at location p due to wind from wind direction wdir in the absence of wake interference from other turbines, pi=ith element of set I, $x_{pi}$=0 or 1, and δ=wind deficit. P0wdir can be calculated according to the equation shown in FIG. 6C.

Or if the power curve is taken into consideration the power production across all turbines may be calculated according to the nonlinear objective function shown in FIG. 6J, wherein P!=power, p=a location on the grid, $x_p$=is a binary variable, either 0 or 1 that indicates whether or not a wind turbine is located at that location, wdir=wind direction, U=original windspeed, frac=probability of wind direction wdir and wind speed U occurring, $PC_t$=power curve function, and W=wind deficit at location p from wind direction.

The layout optimization problem has a non-linear objective and linear constraints as shown in equation 8. The optimization problem can be effectively solved by a "Branch-and-Bound" approach. A branch and bound algorithm, in one embodiment, may be implemented for finding optimal solutions of various optimization problems, especially in discrete and combinatorial optimization. The approach employs a systematic solving of all candidate solutions, and a discarding of solutions that do not meet a certain criteria.

In one embodiment, at each step of the search for an optimal layout, a binary variable, either 0 or 1, is assigned to each possible wind turbine location. A '0' indicates that a wind turbine is not placed at the location, while a '1' indicates that a wind turbine is placed at the location. The worst case complexity is $O(2^m)$, where m is the number of potential locations. A lower bound, i.e., the maximum possible amount of power produced from a given layout is calculated, and if the lower bound is smaller (the amount of power produced by the given layout is less) than the best solution found so far for another layout, the search node is pruned (the given layout is discarded as a possible solution). The optimization requires the maximum number of turbines that can be placed on the windfarm to be known. If the optimization model is constrained in terms of cost as opposed to number of turbines, then the number of turbines allowed can be estimated by using the cheapest feasible locations with respect to the partial layout up to the allowed budget.

In one embodiment of the optimization method, wind data is measured at each possible location for a turbine. An example of such wind data is shown in FIG. 4. The wind data is used to calculate an energy yield for a given layout of turbines on the grid according to a nonlinear objective function, e.g., one of the functions shown in FIG. 6I or 6J. In one embodiment, the wind data acts as a constraint on the nonlinear objective function. A bounding heuristic is implemented to compare the calculated energy yield for a given layout of turbines, and if the calculated energy yield is greater than the current lower bound, then the current lower bound is replaced with the calculated energy yield. If the calculated energy yield is lower than the current lower bound, then the layout of turbines is discarded. These steps are repeated through all the possible combinations of layouts on the grid until the optimal layout, i.e., the layout resulting in the greatest calculated energy yield is discovered.

The constraints are set according to the equations shown in FIGS. 6K, 6L and 6M. FIG. 6K is one embodiment of a pairwise proximity constraint between two turbines, wherein $x_{p1}$ and $x_{p2}$ are two different locations on the grid and distcutoff=a cutoff distance that defines a minimum distance between two turbines. Typically engineering and maintenance considerations specify a distance cutoff between turbine locations. FIG. 6L describes one embodiment of a budget constraint that restricts the total cost or the total number of turbines to be placed. Under the budget constraint, the total installation cost for placement of all the turbines on a windfarm cannot exceed a certain value. FIG. 6M illustrates that the placement of a turbine at a location, designated as $x_p$, can be expressed as binary variable, '0' or '1'. In one embodiment, a '1' indicates that a turbine is or should be placed at a certain location and a '0' indicates that a turbine should not be placed at a certain location.

In order to prune the search effectively, an admissible heuristic is used to bound the solutions. The heuristic computes an upper bound at each node as follows: At each search node with 'k' assigned turbines (out of 'n' turbines), and 'm' number of locations:

For (n–k) unplaced turbines:

a) placing a turbine at a location on said grid, said location constrained by a proximity constraint;

b) calculating the energy yield produced by the turbine placed at the location on said grid;

c) repeating steps a and b for different locations on said grid;

d) identifying the n–k locations on said grid that result in the greatest energy yield;

e) summing the energy yield produced by the turbines at the identified n–k locations to calculate said upper bound for an entire layout; and f) comparing said upper bound to the current lower bound, and if said upper bound is less than the current lower bound, discarding any layout that utilizes k assigned turbines.

As an example of the heuristic for computing the upper bound, assume there are 10 turbines to be placed on the grid, i.e., n=10, and 3 of those turbines have already been placed on the grid at specific locations, i.e., k=3. Then, n–k=10–3=7 and there are 7 turbines out of 10 that need to be placed on the grid. The number of locations in which these turbines can be placed is defined as 'm'. Assume that there are initially 100 locations on the grid in which a turbine can be placed. Because there are 3 turbines already placed on the grid, m=100–3=97. There are 97 locations remaining on the grid in which to place the 7 turbines. Each of the 7 turbines are placed at a location which produces the greatest energy yield. The energy yield for the entire layout of all the turbines is calculated to produce an upper bound, and this upper bound is compared to the current lower bound. If the calculated upper bound is less than the lower bound, then any layout that utilizes a layout with 3 turbines placed on these specific locations results in a less than optimal energy yield and these layouts are discarded from the search process. Calculation of the upper bound in this manner can be used to increase the speed for which the optimal layout of the windfarm is discovered because it allows a portion of the possible combinations of turbine placements to be ignored.

This optimization method requires O(m) wake evaluations to determine the optimal placement of a turbine by taking into account wake interferences. A wake evaluation refers to computing the power produced by a single turbine taking into account the wind distribution and the wake effects of other turbines. For each direction sector, the wind speed deficit is computed based on turbines placed on locations in the interference set. This wind deficit is applied to all wind distribution tuples in that direction sector, and the actual power is computed using the power curve of the turbine.

In one embodiment, the method is implemented by selecting the number of turbines 102 to be distributed throughout the windfarm site. A grid or checkerboard pattern is overlaid onto the windfarm site to divide the site into multiple squares (as shown in FIG. 2). A turbine 102 may be placed into each square. In one embodiment, the first turbine 102 is placed on an outer boundary (along the edge) of the grid. Subsequent turbines 102 are placed at locations on the grid that maximize the amount of power produced by the subsequent turbine, and consequently minimize wake interference from all the other turbines previously placed on the grid. After all of the turbines have been placed on the grid, the total amount of power produced by all the turbines can be calculated according to equations 5 or 6. The method can be repeated for different layouts and placements of turbines on the grid, and the amount of power produced calculated for each layout to determine which layout and placement of turbines is optimal.

Referring now to FIG. 3, a table comparing the amount of power produced using a checkerboard turbine layout vs. the turbine layout resulting from the method of the present invention in six different windfarm layouts (scenarios) 302, 304, 306, 308, 310 and 312 in an example implementation is provided. Each of the six layouts differs in size and dimensions, but have the same number of turbines distributed throughout. In the present example, nine turbines are used for all of the layouts, however any number of turbines within the budget constraint may be selected.

As an example, layout 302 is an 11×11 grid providing 121 possible placement locations for each turbine. The placement locations in this example are spaced one radius distance apart (40 meters). When the prior art checkerboard turbine layout is used for placement of the turbines where in this example the turbines are spaced at distance of 5 radii or 2.5 diameters (200 meters) apart, 6537.4 KWh/yr are produced by the nine turbines. However, when placement of the turbines is optimized according to the method of the present invention, 6634.53 KWh/yr are produced, for an improvement of 1.49%. Layouts 304, 306, 308, 310 and 312 also show similar improvements from using the optimization method of the present invention. Layout 310 is a 13×21 grid providing 273 possible placement locations for each turbine. When the prior art checkerboard layout is used for placement of the turbines, 6955.6 KWh/yr are produced by the nine turbines. However, when placement of the turbines is optimized according to the present invention, 7214.62 KWh/yr are produced, for an improvement of 3.72%.

Computing the power generated from each of the layouts allows for comparisons between different layouts. For example, when layout 306 is optimized according to the present invention, 6964.94 KWh/yr are produced by the nine turbines as compared to the checkerboard layout of layout 310, which produces 6955.6 KWh/yr. Layout 306 requires 268,800 square meters of space, while layout 310 requires 460,800 square meters of space. The optimized version of layout 306 results in more power production while using 58.3% less space than the checkerboard layout of layout 310. Thus, the optimization method can be applied to multiple layouts and used to select the layout that results in the greatest production of power, or to select a layout that results in a certain level of power while minimizing the amount of space required for the windfarm layout. In another embodiment, a cost constraint or budget constraint can be applied to any of the different layouts to select a layout that is the most profitable. The most profitable windfarm layout is the layout associated with the lowest installation cost for all of the turbines that also results in an acceptable energy yield, i.e., an energy yield greater than a threshold value.

Figure 5:
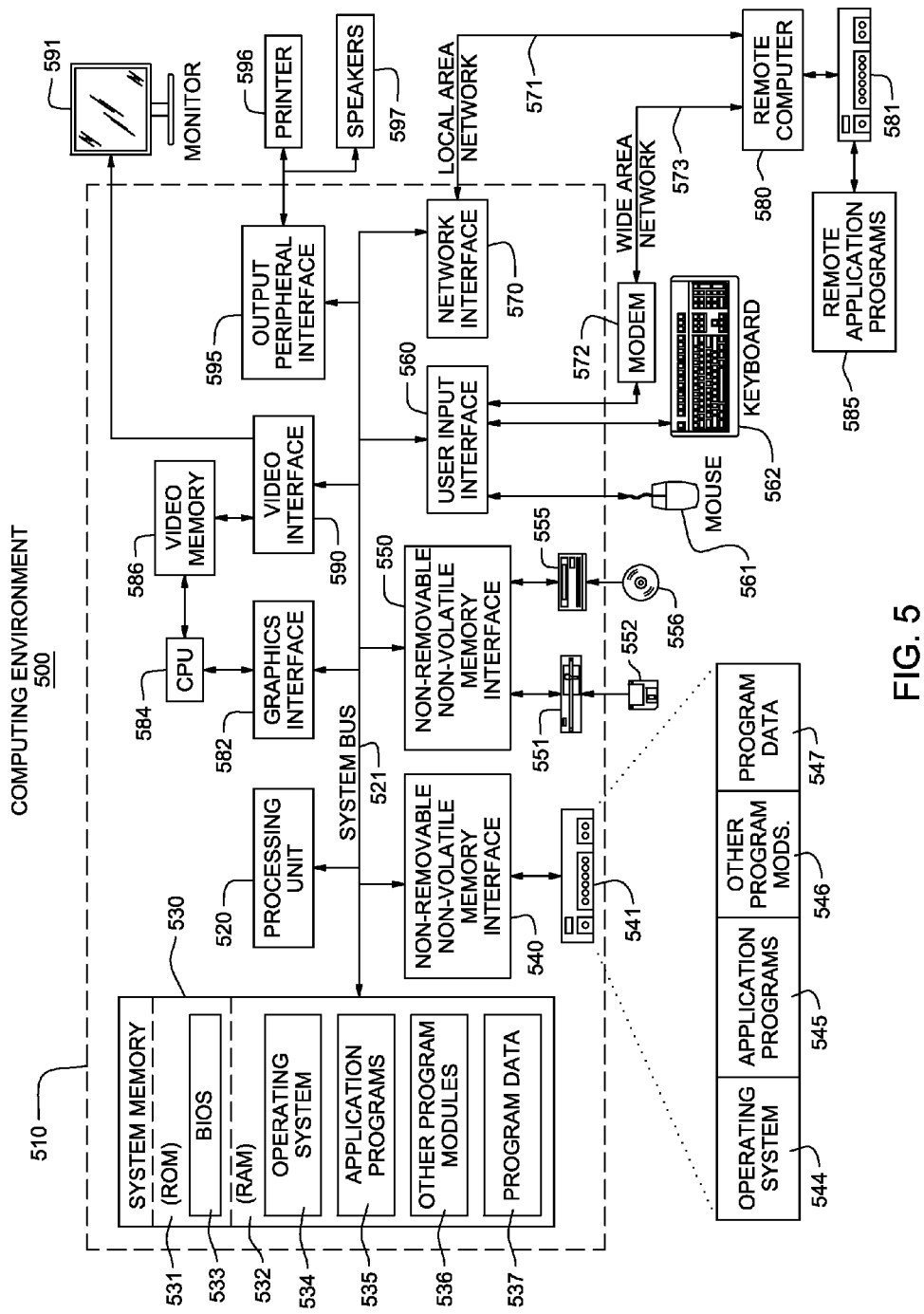
FIG. 5 is a computing environment for implementing one embodiment of the invention.

FIG. 5, thus, illustrates an example of a suitable computing system environment 500 in which the invention may be implemented. The computing system environment 500 is only one example of a suitable computing environment and is not intended to suggest any limitation as to the scope of use or functionality of the invention. Neither should the computing environment 500 be interpreted as having any dependency or requirement relating to any one or combination of components illustrated in the exemplary operating environment 500.

With reference to FIG. 5, an exemplary system for implementing the invention includes a general purpose-computing device in the form of a computer 510. Components of computer 510 may include, but are not limited to, a processing unit 520, a system memory 530, and a system bus 521 that couples various system components including the system memory to the processing unit 520. The system bus 521 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 510 typically includes a variety of computer readable media. Computer readable media can be any available media that can be accessed by computer 510 and includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 510.

Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer readable media.

The system memory 530 includes computer storage media in the form of volatile and/or nonvolatile memory such as read only memory (ROM) 531 and random access memory (RAM) 532. A basic input/output system 533 (BIOS), containing the basic routines that help to transfer information between elements within computer 510, such as during start-up, is typically stored in ROM 531. RAM 532 typically contains data and/or program modules that are immediately accessible to and/or presently being operated on by processing unit 320. By way of example, and not limitation, FIG. 5 illustrates an operating system 533, application programs 535, other program modules 536, and program data 537.

The computer 510 may also include other removable/non-removable, volatile/nonvolatile computer storage media. By way of example only, FIG. 5 illustrates a hard disk drive 541 that reads from or writes to non-removable, nonvolatile magnetic media, a magnetic disk drive 551 that reads from or writes to a removable, nonvolatile magnetic disk 552, and an optical disk drive 555 that reads from or writes to a removable, nonvolatile optical disk 556, such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 541 is typically connected to the system bus 521 through a non-removable memory interface such as interface 540, and magnetic disk drive 551 and optical disk drive 555 are typically connected to the system bus 521 by a removable memory interface, such as interface 550.

The drives and their associated computer storage media discussed above and illustrated in FIG. 5 provide storage of computer readable instructions, data structures, program modules and other data for the computer 510. In FIG. 5, for example, hard disk drive 541 is illustrated as storing operating system 544, application programs 545, other program modules 546, and program data 547. Note that these components can either be the same as or different from operating system 534, application programs 535, other program modules 536, and program data 537. Operating system 544, application programs 545, other program modules 546, and program data 547 are given different numbers here to illustrate that, at a minimum, they are different copies.

A user may enter commands and information into the computer 510 through input devices such as a keyboard 562 and pointing device 561, commonly referred to as a mouse, trackball or touch pad. Other input devices (not shown) may include a microphone, joystick, game pad, satellite dish, scanner, or the like. These and other input devices are often connected to the processing unit 520 through a user input interface 560 that is coupled to the system bus 521, but may be connected by other interface and bus structures, such as a parallel port, game port or a universal serial bus (USB).

A monitor 591 or other type of display device is also connected to the system bus 521 via an interface, such as a video interface 590. A graphics interface 582, such as Northbridge, may also be connected to the system bus 521. Northbridge is a chipset that communicates with the CPU, or host-processing unit 520, and assumes responsibility for accelerated graphics port (AGP) communications. One or more graphics processing units (GPUs) 584 may communicate with graphics interface 582. In this regard, GPUs 584 generally include on-chip memory storage, such as register storage and GPUs 584 communicate with a video memory 586. GPUs 584, however, are but one example of a coprocessor and thus a variety of co-processing devices may be included in computer 510. A monitor 591 or other type of display device is also connected to the system bus 521 via an interface, such as a video interface 590, which may in turn communicate with video memory 586. In addition to monitor 591, computers may also include other peripheral output devices such as speakers 597 and printer 596, which may be connected through an output peripheral interface 595.

The computer 510 may operate in a networked environment using logical connections to one or more remote computers, such as a remote computer 580. The remote computer 580 may be a personal computer, a server, a router, a network PC, a peer device or other common network node, and typically includes many or all of the elements described above relative to the computer 510, although only a memory storage device 581 has been illustrated in FIG. 5. The logical connections depicted in FIG. 5 include a local area network (LAN) 571 and a wide area network (WAN) 573, but may also include other networks. Such networking environments are commonplace in offices, enterprise-wide computer networks, intranets and the Internet.

When used in a LAN networking environment, the computer 510 is connected to the LAN 571 through a network interface or adapter 570. When used in a WAN networking environment, the computer 510 typically includes a modem 572 or other means for establishing communications over the WAN 573, such as the Internet. The modem 572, which may be internal or external, may be connected to the system bus 521 via the user input interface 560, or other appropriate mechanism. In a networked environment, program modules depicted relative to the computer 510, or portions thereof, may be stored in the remote memory storage device. By way of example, and not limitation, FIG. 5 illustrates remote application programs 585 as residing on memory device 581. It will be appreciated that the network connections shown are exemplary and other means of establishing a communications link between the computers may be used.

One of ordinary skill in the art can appreciate that a computer 510 or other client device can be deployed as part of a computer network. In this regard, the present invention pertains to any computer system having any number of memory or storage units, and any number of applications and processes occurring across any number of storage units or volumes. The present invention may apply to an environment with server computers and client computers deployed in a network environment, having remote or local storage. The present invention may also apply to a standalone computing device, having programming language functionality, interpretation and operation capabilities.

The above methods allow the incorporation of several complex real world constraints in determining the optimal layout of a windfarm. For example in a real world setting there are several proximity constraints that restrict how close two turbines can be placed with respect to each other. In one embodiment, these constraints can be modeled incorporating logical constraints that are modeled as linear inequalities.

Budget constraints can also be imposed either in terms of the total power yield required or the total number of turbines that can be placed and these are handled by this method. Budget and turbine costs take into account the cost of each turbine, and the construction costs at each location. Certain locations, such as seabed locations, may be more expensive to place turbines and require the attachment of support cables to the sea floor to support the turbine. The total budget functions as a constraint on turbine costs and construction costs and may limit the number of turbines that can be placed at a particular wind farm site.

One embodiment models the objective of the optimization problem as the total power yield or the total return on investment. There are several tradeoffs that are modeled in this method. One is associated with the cost of transmission lines between the various turbines. As the turbines are more spread out, it leads to higher transmission costs but maybe lower wake interference and hence higher power yield. Several cost and yield related metrics can be incorporated into the objective of our mathematical programming approach.

This embodiment models the objective of the optimization problem as the total power yield or the total return on investment. There are several tradeoffs that are modeled in this method. One is associated with the cost of transmission lines between the various turbines. As the turbines are more spread out, it leads to higher transmission costs but maybe lower wake interference and hence higher power yield. Several cost and yield related metrics can be incorporated into the objective of our mathematical programming approach.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a 'circuit,' 'module' or 'system.' Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction operation system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction operation system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the 'C' programming language or similar programming languages. The program code may operate entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which operate via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which operate on the computer or other programmable apparatus provide processes for implementing the functions/acts specified in the flowchart and/or block diagram block or blocks.

Referring now to FIGS. 1 through 6. The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be operated substantially concurrently, or the blocks may sometimes be operated in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for placing one or more wind turbines in a windfarm, the method further comprising:
    identifying a first location for placing a first wind turbine;
    calculating a first energy produced by the first placed wind turbine;
    identifying an additional location for placing an additional wind turbine;
    calculating a total energy produced by the first and additional wind turbines;
    repeating the identifying the first location, the calculating the first energy, the identifying the additional location, and the calculating the total energy until all the one or more wind turbines are placed in the windfarm,
    wherein the total produced energy is calculated by $$maxP! = \sum_{p} \left\{ x_p * \sum_{(wdir,U,frac)} frac * PC_t((1 - \delta V_{wdir,p}(x)) * U) \right\},$$

in which P! is a power, p is the first location or the additional location, $x_p$ is 0 or 1, wdir is a wind direction, U is an original wind speed, frac is a probability that the wind direction wdir and a wind speed U occur, $PC_t$ is a power curve function, $\delta V$ is wind deficit at a location p from the wind direction,
    wherein a processor coupled to a memory device is configured to perform: the identifying the first location, the calculating the first energy, the identifying the additional location, the calculating the total energy, and the repeating.

2. The method according to claim 1, wherein if a wind speed doubles in the windfarm, an amount of power produced by the one or more wind turbines increases by a factor of eight.

3. The method according to claim 1, wherein the identifying the additional location comprises:
    selecting the additional location that maximizes the total produced energy;
    selecting the additional location that minimizes an amount of space required for the additional wind turbine; or
    selecting the additional location that is most profitable, the most profitable location causing a lowest installation cost for the additional wind turbine but an energy yield at the additional location is higher than a threshold.

4. The method of claim 1, wherein the total produced energy is calculated by $$maxP' = \sum_{p} \left\{ x_p * \sum_{wdir} \left\{ P0_{wdir} * \left(1 - \sqrt{\sum_{pi \in I_{p,wdir}} (x_{pi} * \delta V_{wdir,pi,p}^2)} \right)^3 \right\} \right\}$$

wherein P' is power, P0wdir is a power produced by a wind turbine at the location p due to wind from the wind direction wdir in an absence of wake interference from other turbines, pi is ith element of a set I, $x_{pi}$ is 0 or 1.

5. The method of claim 1, wherein the calculation is constrained by a cost constraint according to:

$$\sum_{p} x_p * \text{cost}_p \leq B$$

and $x_p \in \{0,1\} \forall p$ wherein $x_p$ is a location in the windfarm and $\text{cost}_p$ is an installation cost associated with the location defined by $x_p$.

6. The method of claim 1, wherein said calculation is constrained by a proximity constraint:

$x_{p1} + x_{p2} \leq 1 \ \forall p1, p2: p1!=p2, \text{dist}(p1,p2) < \text{distcutoff}$ and $x_p \in \{0,1\} \forall p$ wherein $x_{p1}$ and $x_{p2}$ are two different locations on the windfarm and distcutoff is a cutoff distance that defines a minimum distance between two wind turbines.

7. A structure comprising: one or more wind turbines, wherein said one or more wind turbines are placed in an optimized layout to maximize energy yield produced by the turbines;
    said optimal layout determined by
    identifying a first location for placing a first wind turbine;
    calculating a first energy produced by the first placed wind turbine;
    identifying an additional location for placing an additional wind turbine;
    calculating a total energy produced by the first and additional wind turbines
    repeating the identifying the first location, the calculating the first energy, the identifying the additional location, and the calculating the total energy until all the one or more wind turbines are placed in the structure,
    wherein the total produced energy is determined by:

$$maxP! = \sum_{p} \left\{ x_p * \sum_{(wdir,U,frac)} frac * PC_t((1 - \delta V_{wdir,p}(x)) * U) \right\},$$

in which P! is a power, p is the first location or the additional location, $x_p$ is 0 or 1, wdir is a wind direction, U is an original wind speed, frac is a probability that the wind direction wdir and a wind speed U occur, $PC_t$ is a power curve function, $\delta V$ is wind deficit at a location p from the wind direction.

8. The structure according to claim 7, wherein the additional location is identified by:
    selecting the additional location that maximizes the total produced energy;
    selecting the additional location that minimizes an amount of space required for the additional wind turbine; or
    selecting the additional location that is most profitable, the most profitable location causing a lowest installation cost of the additional wind turbine but an energy yield at the additional location is higher than a threshold.

9. A computer program product for placing one or more wind turbines in a windfarm, the computer program product comprising a computer readable storage medium, the computer readable storage medium excluding a propagating signal, the computer readable storage medium readable by a processing circuit and storing instructions run by the processing circuit for performing a method, said method steps comprising:
    identifying a first location for placing a first wind turbine;
    calculating a first energy produced by the first placed wind turbine;
    identifying an additional location for placing an additional wind turbine;
    calculating a total energy produced by the first and additional wind turbines
    repeating the identifying the first location, the calculating the first energy, the identifying the additional location, and the calculating the total energy until all the one or more wind turbines are placed in the windfarm,
    wherein the total produced energy is calculated by $$maxP! = \sum_p \left\{ x_p * \sum_{(wdir,U,frac)} frac * PC_t((1 - \delta V_{wdir,p}(x)) * U) \right\},$$

in which P! is a power, p is the first location or the additional location, $x_p$ is 0 or 1, wdir is a wind direction, U is an original wind speed, frac is a probability that the wind direction wdir and a wind speed U occur, $PC_t$ is a power curve function, $\delta V$ is wind deficit at a location p from the wind direction,
    wherein a processor coupled to a memory device is configured to perform: the identifying the first location, the calculating the first energy, the identifying the additional location, the calculating the total energy, and the repeating.

10. The computer program product according to claim 9, wherein if a wind speed doubles in the windfarm, an amount of power produced by the one or more wind turbines increases by a factor of eight.

11. The computer program product according to claim 9, wherein in order to identify the additional location, the control circuit is further configured to perform:
    selecting the additional location that maximizes the total produced energy;
    selecting the additional location that minimizes an amount of space required for the additional wind turbine; or
    selecting the additional location that is most profitable, the most profitable location causing a lowest installation cost of the additional wind turbine but an energy yield at the additional location is higher than a threshold.

12. The computer program product of claim 9, wherein the total produced energy is calculated by $$maxP' = \sum_p \left\{ x_p * \sum_{wdir} \left\{ P0_{wdir} * \left(1 - \sqrt{\sum_{pi \in I_{p,wdir}} (x_{pi} * \delta V^2_{wdir,pi,p})} \right)^3 \right\} \right\}$$

wherein P' is power, P0wdir is a power produced by a wind turbine at location p due to wind from the wind direction wdir in an absence of wake interference from other turbines, pi ith element of a set I, $x_{pi}$ is 0 or 1.

13. The computer program product of claim 9, wherein the calculation is constrained by a cost constraint according to:

$$\sum_p x_p * \text{cost}_p \le B$$

and $$x_p \in \{0,1\} \forall p$$

wherein $x_p$ is a location in the windfarm and $\text{cost}_p$ is an installation cost associated with the location defined by $x_p$.

14. The computer program product of claim 1, wherein said calculation is constrained by a proximity constraint:

$$x_{p1} + x_{p2} \le 1 \ \forall p1,p2: p1!=p2, \text{dist}(p1,p2) < \text{distcutoff}$$

and $$x_p \in \{0,1\} \forall p$$

wherein $x_{p1}$ and $x_{p2}$ are two different locations on the windfarm and distcutoff is a cutoff distance that defines a minimum distance between two wind turbines.

15. A system for optimally placing one or more wind turbines in a windfarm, the method further comprising:
    at least one memory device;
    at least one processor device,
    wherein the processor device is further configured to perform
        identifying a first location for placing a first wind turbine;
        calculating a first energy produced by the first placed wind turbine;
        identifying an additional location for placing an additional wind turbine;
        calculating a total energy produced by the first and additional wind turbines
        repeating the identifying the first location, the calculating the first energy, the identifying the additional location, and the calculating the total energy until all the one or more wind turbines are placed in the windfarm,
        wherein the total produced energy is calculated by $$maxP! = \sum_p \left\{ x_p * \sum_{(wdir,U,frac)} frac * PC_t((1 - \delta V_{wdir,p}(x)) * U) \right\},$$

in which P! is a power, p is the first location or the additional location, $x_p$ is 0 or 1, wdir is a wind direction, U is an original wind speed, frac is a probability that the wind direction wdir and a wind speed U occur, $PC_t$ is a power curve function, $\delta V$ is wind deficit at a location p from the wind direction.

16. The system according to claim 15, wherein if a wind speed doubles in the windfarm, an amount of power produced by the one or more wind turbines increases by a factor of eight.

17. The system according to claim 15, wherein the identifying the additional location comprises:
   selecting the additional location that maximizes the total produced energy;
   selecting the additional location that minimizes an amount of space required for the additional wind turbine; or
   selecting the additional location that is most profitable, the most profitable location causing a lowest installation cost of the additional wind turbine but an energy yield at the additional location is higher than a threshold.

18. The system of claim 15, wherein the total produced energy is calculated by $$maxP' = \sum_p \left\{ x_p * \sum_{wdir} \left\{ P0_{wdir} * \left(1 - \sqrt{\sum_{pi \in I_{p,wdir}} (x_{pi} * \delta V_{wdir,pi,p}^2)} \right)^3 \right\} \right\}$$

wherein P' is power, P0wdir is a power produced by a wind turbine at location p due to wind from the wind direction wdir in an absence of wake interference from other turbines, pi is ith element of a set I, $x_{pi}$ is 0 or 1.

19. The system of claim 15, wherein the calculation is constrained by a cost constraint according to:

$$\sum_p x_p * \text{cost}_p \leq B$$

and $$x_p \in \{0,1\} \forall p$$

wherein $x_p$ is a location in the windfarm and $\text{cost}_p$ is an installation cost associated with the location defined by $x_p$.

20. The system of claim 15, wherein said calculation is constrained by a proximity constraint:

$x_{p1} + x_{p2} \leq 1$ $\forall p1, p2: p1 != p2, \text{dist}(p1,p2) < \text{distcutoff}$ and $x_p \in \{0,1\} \forall p$ wherein $x_{p1}$ and $x_{p2}$ are two different locations on the windfarm and distcutoff is a cutoff distance that defines a minimum distance between two wind turbines.

* * * * *